United States Patent
Ngo et al.

(10) Patent No.: US 6,235,654 B1
(45) Date of Patent: May 22, 2001

(54) PROCESS FOR FORMING PECVD NITRIDE WITH A VERY LOW DEPOSITION RATE

(75) Inventors: Minh Van Ngo, Fremont, CA (US); Hartmut Ruelke, Dresden-Wilschdorf (DE); Robert Huertas, Hollister, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/625,511

(22) Filed: Jul. 25, 2000

(51) Int. Cl.$^7$ .......................... H01L 21/31; H01L 21/469
(52) U.S. Cl. ............................... 438/792; 438/791
(58) Field of Search .................... 438/763, 787, 438/791, 792

(56) References Cited

U.S. PATENT DOCUMENTS

| | | | |
|---|---|---|---|
| 4,854,263 | * 8/1989 | Chang et al. | 118/715 |
| 5,736,423 | * 4/1998 | Ngo | 437/238 |
| 5,904,529 | * 5/1999 | Gardner et al. | 438/286 |
| 5,925,914 | 7/1999 | Jiang et al. | 257/344 |
| 6,077,764 | * 6/2000 | Sugiarto et al. | 438/597 |

* cited by examiner

*Primary Examiner*—Richard Booth
*Assistant Examiner*—Alexander G. Ghyka

(57) ABSTRACT

A process for very low deposition rate plasma-enhanced chemical vapor deposition (PECVD) of nitride is provided. A nitride layer is used, for example, as a precursor for nitride spacers formed on the sidewalls of a polysilicon gate. The nitride layer may be produced in a PECVD chamber, using an increased flow rate of nitrogen applied to the chamber, an increased flow rate of molecular nitrogen, and a reduced flow rate of ammonia. The RF power is reduced, as well as the reactor pressure. This produces a nitride layer that exhibits improvements in density, refractive index, step coverage, and thickness non-uniformity within a wafer and from wafer-to-wafer.

12 Claims, 2 Drawing Sheets

PROCESS FOR FORMING PECVD NITRIDE WITH A VERY LOW DEPOSITION RATE

FIELD OF THE INVENTION

The present invention relates to the field of semiconductor processing, and in particular, to the formation of a nitride layer on a semiconductor wafer.

BACKGROUND OF THE INVENTION

Various integrated circuits utilize structures formed with nitride for various purposes. For example, a spacer formed of nitride may be provided on the sidewalls of a gate during the front-end of the line (FEOL) processing. The nitride spacers are typically formed on the gate sidewalls after a source/drain extension implant has been performed. Following the formation of the nitride spacers, a second dopant implantation is performed to form the source/drains. The nitride spacers prevent the additional dopants in the source/drain implant from being implanted into the source/drain extension area underneath the nitride spacers. This maintains a lightly doped extension region, while allowing the remaining portions of the source/drain region to be doped appropriately.

It is preferable when forming nitride spacers to provide a low deposition rate in order to provide better process control. In a known plasma-enhanced chemical vapor deposition (PECVD) process, used to provide a nitride layer, silane ($SiH_4$) is provided to the deposition chamber at a flow rate of between 151 to 183 sccm. Nitrogen ($N_2$) is provided at a flow rate of 3000 sccm. Ammonia ($NH_3$) is provided at a flow rate of between 120 to 140 sccm. Pressure is maintained in the deposition chamber at 4.9 torr, with a temperature of 400° C. RF power is applied in the chamber at 625 watts and the spacing is 540 mils.

The results of the nitride deposition process above deposits nitride at a deposition rate of 100 Å/sec. The nitride layer has a refractive index comprising RI=1.915, with step coverage=70%. Non-uniformity of the thickness within a wafer is 1.5%. The non-uniformity in the thickness from wafer-to-wafer is 0.5%. Improvements in the quality of the nitride layer is desirable.

SUMMARY OF THE INVENTION

There is a need for a production-worthy process of PECVD nitride spacer deposition with wide process margin for better process control to produce a nitride layer with excellent step coverage, and improved thickness uniformity within wafer and wafer-to-wafer.

This and other needs are met by embodiments of the present invention which provide a method of depositing nitride on a wafer in a plasma-enhanced chemical vapor deposition reactor, comprising the steps of applying reactant gasses to the wafer, including silane at a flow rate in a range of 190 to 270 sccm, nitrogen at a flow rate in a range of 4000 to 9000 sccm, an ammonia in a range of 30 to 100 sccm. Reactor pressure is maintained between 3 to 4.8 torr, while RF power is applied between 300 to 500 watts.

In certain embodiments of the invention, silane is applied at a flow rate of 230+/−10% sccm, nitrogen is applied at a flow rate of 6500+/−10% sccm, and ammonia is applied at a flow rate of 65+/−10% sccm. The pressure is maintained in the chamber at 4.4 torr at 400° C. The RF power is equal to 430 watts and the spacing is equal to 600 mils.

By using the processes of the present invention, a deposition rate of nitride may be obtained that is very low, e.g. 42 Å/min. An excellent step coverage, which compares favorably with that of nitride layers produced by the LPCVD process, is achieved with the present invention. For example, the step coverage of the nitride layer produced in accordance with embodiments of the present invention may be 80%, in comparison with step coverage of 70% produced by the prior art process. Also, the non-uniformity of the thickness within wafers is reduced to 0.7%, from the prior art 1.5%, and the wafer-to-wafer thickness non-uniformity is reduced to 0.4%, in comparison to the prior art 0.5%. Further, the present invention also reduces a nitride layer with a dense film having a refractive index (RI) equal to 2.0, an improvement over the RI of 1.915 produced by the prior art process.

The earlier-stated needs are also met by another embodiment of the present invention which provides a method for producing a semiconductor device comprising the steps of forming a gate having sidewalls and forming an oxide layer on the gate sidewalls. The oxide layer is a super low deposition rate PECVD oxide layer having a deposited thickness of less than 200 angstroms, refractive index greater than or equal to 1.48, thickness non-uniformity of 1.1% or less, and step coverage of 90% or greater. A nitride layer is formed on the oxide layer. The nitride layer is a very low deposition rate PECVD nitride layer with a refractive index greater than or equal to 1.95, and with a step coverage of 75% or greater, with a thickness non-uniformity within a wafer of 1.0%, and step coverage of 75% or greater.

The semiconductor device provided by the above-described methods of the present invention has an increased P-channel Idsat:Idoff by 10%, compared to that of low pressure chemical vapor deposition (LPCVD) methods.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems associated with the formation of a nitride layer, used, for example, in forming a nitride spacer in front-end of line (FEOL) microprocessor device processing. Previous processes provide a nitride layer that may be deposited with a deposition of 100 Å/sec., a refractive index of 1.915, step coverage of 70%, thickness non-uniformity within a wafer of 1.5%, and thickness non-uniformity from wafer-to-wafer of 0.5%. The present invention provides a very low deposition rate, such as 42 Å/min., and a deposition layer with excellent step coverage that matches that of LPCVD processes. Wafer-to-wafer thickness uniformity is improved, which provides better critical dimension (CD) control. Furthermore, a dense film with a refractive index of 2.0 may be achieved. When the very low deposition rate nitride spacer is employed with a ultra-low deposition rate liner oxide, in accordance with certain embodiments of the invention, a device with an increase in the P-channel Idsat:Idoff of approximately 10%, compared to that of LPCVD, is achieved.

Figure 1A:
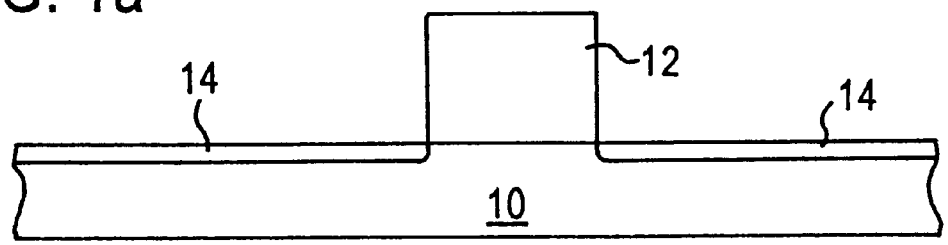
FIGS. 1A, 1B, 1C, 1D, 1E depict the formation of a semiconductor device in accordance with the methods of the present invention and having a nitride spacer formed by a very low deposition rate PECVD.

FIG. 1A depicts a cross-section of a semiconductor wafer during one stage of processing, in order to illustrate a possible use of a deposited nitride layer in accordance with embodiments of the present invention. However, other uses of a thin nitride layer may be provided by the present invention.

The structure of FIG. 1A shows a substrate 10 in which a polysilicon gate 12 has been previously formed. Souce/drain extensions 14 are provided by introducing dopants in a conventional manner into the substrate 10.

Figure 1B:
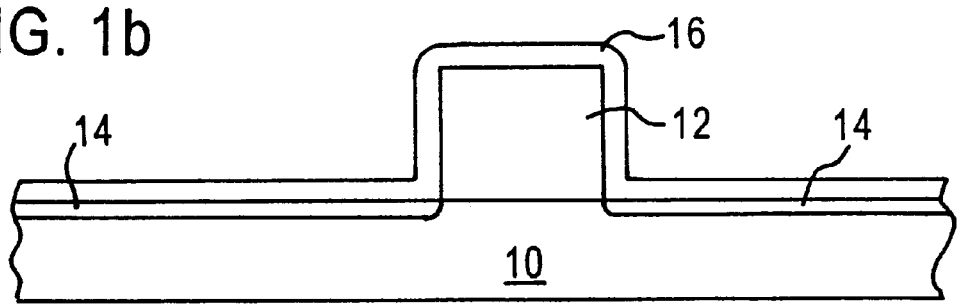

FIG. 1B depicts a semiconductor wafer following a deposition of a very thin deposition layer 16. The layer 16 is an oxide layer in the present invention, such as a silicon dioxide ($SiO_2$) layer. In certain embodiments, the oxide layer 16 is less than 200 angstroms and may be, for example, 50 angstroms of thickness. Although in certain embodiments the oxide layer 16 may be formed in a conventional manner, in certain other embodiments it is advantageous to form the oxide layer 16 in accordance with the below-described process.

Figure 2:
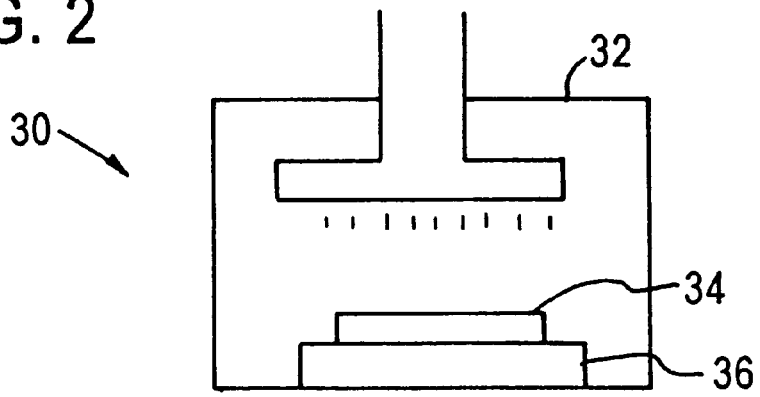
FIG. 2 is a schematic depiction of a PECVD chamber or carrying out the very low deposition rate deposition of nitride on a wafer in accordance with the embodiments of the present invention.

A schematic depiction of a single deposition station PECVD machine, with a dual chamber, is depicted in FIG. 2. An exemplary machine for use with the method of the present invention is an Applied Materials' Producer (TM) PECVD machine dual chamber that provides higher throughput and lower cost of ownership. The PECVD reactor 30 includes a chamber 32 holding a wafer 34. The wafer 34 is placed into the chamber 32 and heated on a heater block 36 before reactant gasses, power and pressure are applied to the chamber 32.

In the oxide deposition process, performed with a super low deposition rate, the reactants in the present invention include silane ($SiH_4$), nitrous oxide $N_2O$) and molecular nitrogen ($N_2$) at a selected pressure and RF power. The deposition parameters are substantially different from the depositin paramaters for a conventional PECVD technique. In the present invention, the silane is applied at a flow rate in a range of 10 to 60 sccm, and preferably at about 35 sccm. Nitrous oxide is applied to the wafer at a flow rate in a range from 200 to 1000 sccm, and preferably at about 650 sccm. The molecular nitrogen is applied to the wafer at a flow rate in a range from 4000 to 8000 sccm, and preferably at 6000 sccm.

In certain embodiments of the invention, the reactor pressure is maintained between 3 and 7 torr, with a preferable reactor pressure of 5.5 torr. The RF power applied is between 100 and 170 watts, with a preferred RF power of 135 watts. The spacing is in a range of 300 to 500 mils, with a preferred spacing of 400 mils.

When the preferred deposition parameters are employed, the process results in a deposition rate of the undoped oxide of 20 Å/sec., a refractor index (RI) equal to 1.48, a thickness non-uniformity of approximately 1.1%, and a step coverage of approximately 90%. These represent significant improvements over results of prior oxide deposition techniques. The variable deposition time provided by the super low deposition rate produces a better process conrol. The oxide film produced is dense, silicon-rich, highly-compresive, with excellent step coverage and acceptable uniformity.

Figure 1C:
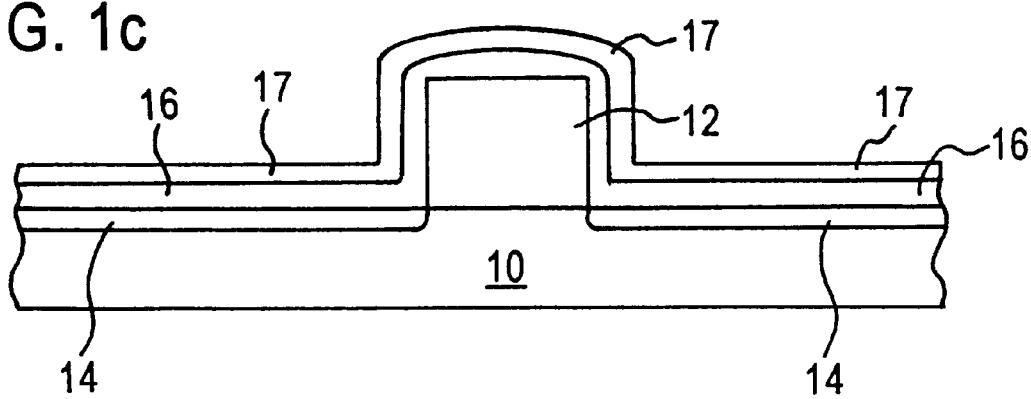

Following the formation of the oxide layer 16, either conventionally or as described above in certain embodiments, a nitride layer 17 is formed on the sidewalls of the polysilicon gate 12 (FIG. 1C). However, the very thin oxide layer 16 remains between the sidewalls of the polysilicon gate 12 and the nitride layer 17 as an oxide liner.

The nitride layer 17 can be formed in the same PECVD reactor 30 that was employed to form the oxide layer 16. In the prior art, the silane was applied at a flow rate of 151–183 sccm, molecular nitrogen was provided at a flow rate of 3000 sccm, and ammonia at a flow rate of 120–140 sccm, at 4.9 torr at 400° C. RF power was applied at 625 watts and the spacing was 540 mils. This produced a layer at a deposition rate of 100 Å/sec., with a refractive index RI of 1.195, step coverage of 70%, thickness non-uniformity within a wafer of 1.5%, and thickness non-uniformity from wafer-to-wafer of 0.5%. The present invention improves upon these results for the nitride layer by employing different process parameters.

For example, the present invention applies reactant gasses to the wafer, including silane at a flow rate in a range of 190 to 270 sccm, and preferably at about 230+/−10% sccm. Molecular nitrogen is applied at a flow rate in a range of 4000 to 9000 sccm, and preferably at a flow rate of 6500+/−10% sccm. Ammonia is provided at a flow rate of 35 to 55 sccm, with a preferred flow rate of 65+/−10% sccm. The pressure in the reactor is maintained between 3 to 4.8 torr, with a preferable reactor pressure of 4.4 torr at 400° C. The RF power applied is between 300 to 500 watts, with a preferred RF power of 430 watts. The spacing is in a range of 500 to 650 mils, with a preferred spacing of 600 mils.

When the preferred nitride deposition parameters are employed, the process results in a deposition rate of the nitride layer 17 of approximately 42 Å/min., a refractive index (RI) of 2.0, step coverage of 80%, thickness non-uniformity within a wafer of 0.7%, an thickness non-uniformity from wafer to-wafer of 0.4%.

Figure 1D:
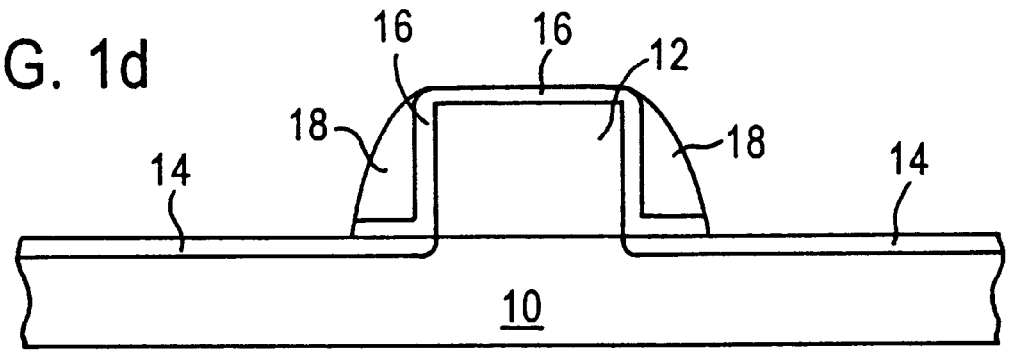

Following the deposition of the nitride layer at a very low deposition rate in accordance with embodiments of the present invention, the nitride layer 17 is subjected to an etching to form nitride spacers 18 on the sidewalls of the polysilicon gate 12. The etching may be an anisotropic etching, such as a reactive ion etching. The very thin oxide layer 16 remains between the sidewalls of the polysilicon gate 12 and the nitride spacers 18 as an oxide liner. This is depicted in FIG. 1D.

Figure 1E:
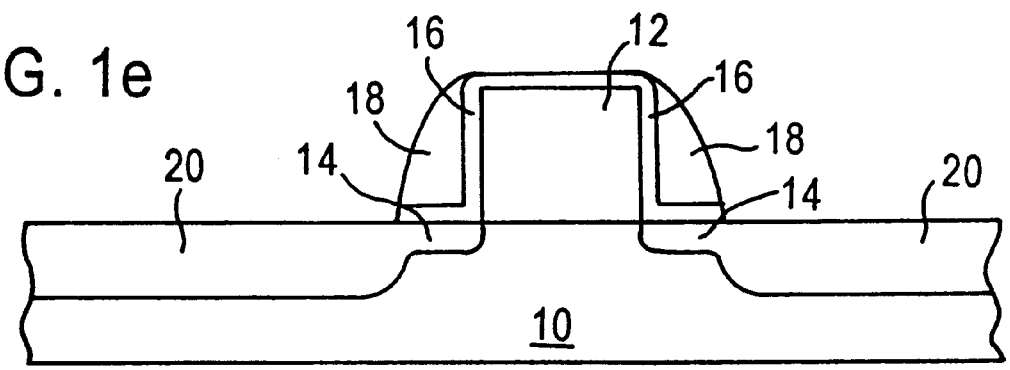

Once the nitride spacers 17 have been formed in accordance with embodiments of the present invention, a dopant implantation and annealing step is performed to form the source/drains 20, as seen in FIG. 1E. The present invention improves the P-channel Idsat:Idoff ratio by approximately 10% in comparision to prior techniques. Although the exact mechanism for this improvement is not known with certainty, it is believed that the present invention provides greater diffusion in the extension regions 14 since this region has more dose retention. The higher concentration dopants below the overlap region of the gate and source/drain extensions would lead to thinner depletion regions, resulting in a higher compacitance. The results of the present invention point to improved boron retention (less segregation) and more activation with the PECVD process of the present invention.

The use of the nitride deposition process of the present invention provides an improvement in the quality of a nitride layer in a semiconductor device produced in front-end of line processing. A very low deposition rate nitride deposition process produces a nitride layer that has improved wafer-to-wafer thickness non-uniformity, wafer thickness non-uniformrity, better step coverage, better refractive index and improved critical dimension control. In embodiments that also employ an ultra-low deposition rate, liner oxide process, provided in certain embodiments of the invention, substantial improvements in the P-channel Idsat:Idoff performance paramater of the semiconductor device have been achieved.

Although the present invention has been described an illustrated in detail, it is to be clearly understood that the same is by way of illustration and example only, and is not to be taken by way of limitation, the scope of the present invention being limited only by the terms of the appended claims.

What is claimed is:

1. A method of depositing nitride on a wafer in a plasma-enhanced chemical vapor deposition (PECVD) reactor, comprising the steps of:

applying reactant gasses to the wafer including silane ($SiH_4$) at a flow rate in a range of 190 to 270 sccm;

nitrogen ($N_2$) at a flow rate in a range of 4000 to 9000 sccm;

ammonia ($NH_3$) in a range of 30 to 100 sccm;

maintaining reactor pressure of between 3 to 4.8 torr; and applying RF power between 300 to 500 watts;

wherein the deposition rate of the nitride is less than 100 Å/min.

2. The method of claim 1, wherein the spacing is in a range of 500 to 650 mils.

3. A method of claim 2, wherein the nitride is deposited on a polysilicon gate.

4. The method of claim 3, wherein deposition of the nitride is a single station deposition.

5. The method of claim 1, wherein the silane is applied to the wafer at a flow rate of about 205 to 255 sccm; nitrogen at a flow rate of 5100 to 6300 sccm; ammonia at a flow rate of 40 to 48 sccm; RF power is applied at about 430 watts; pressure is maintained at about 4.4 torr; and spacing is about 600 mils.

6. The method of claim 5, wherein the deposition rate of the nitride is less than 75 Å/min.

7. The method of claim 6, wherein the deposition rate is about 42 Å/min.

8. A method of forming a semiconductor device, comprising the steps of:

forming a gate having sidewalls;

depositing on the gate sidewalls by PECVD a layer of oxide less than 200 angstroms thick at a deposition rate of less than 50 angstroms/sec; and depositing on the oxide layer with a nitride deposition rate less than 100 Å/min, a nitride layer by PECVD in a PECVD reactor, including applying reactant gases to the wafer including: silane at a flow rate in a range of 190 to 270 sccm, nitrogen at a flow rate in a range from 4500 to 7000 sccm, and ammonia at a flow rate in a range from 35 to 55 sccm, while maintaining reactor pressure of between 3 to 4.8 torr and applying RF power of between 300 and 500 watts.

9. The method of claim 8, wherein the step of depositing the layer of oxide includes applying reactant gases to the wafer in a PECVD reactor including: silane at a flow rate in a range of 10 to 60 sccm; nitrous oxide at a flow rate in a range from 200 to 1000 sccm; and nitrogen at a flow rate in a range from 4000 to 8000 sccm, while maintaining reactor pressure between 3 to 7 torr and applying RF power of between 100 and 170 watts.

10. The method of claim 9, further comprising etching the oxide layer and the nitride layer to form nitride spacers on the gate sidewalls, with an oxide liner between the nitride spacers and the gate sidewalls.

11. The method of claim 10, wherein the nitride layer deposition includes applying the silane at a flow rate of 205 to 255 sccm, nitrogen at a flow rate of 6000 to 7000 sccm, and ammonia at a flow rate of 60 to 70 sccm, while applying RF power at about 430 watts, maintaining pressure at about 4.4 torr, and spacing is about 600 mils.

12. The method of claim 11 wherein the oxide layer deposition includes applying the silane at a flow rate of about 35 sccm, nitrous oxide at about 650 sccm, nitrogen at about 6000 sccm, with RF power applied at about 135 watts, maintaining pressure at about 5.5 torr, and spacing is about 400 mils.

* * * * *